United States Patent [19]

Tanski

[11] 4,267,534
[45] May 12, 1981

[54] SURFACE ACOUSTIC WAVE REFLECTORS WITH WEIGHTED ARRAYS OF SEGMENTED AND NON-SEGMENTED LINEAL ELEMENTS

[75] Inventor: William J. Tanski, Maynard, Mass.

[73] Assignee: Sperry Corporation, New York, N.Y.

[21] Appl. No.: 152,463

[22] Filed: May 23, 1980

[51] Int. Cl.³ .................. H03H 9/02; H03H 9/64; H03H 9/68
[52] U.S. Cl. .................... 333/153; 333/194; 333/195
[58] Field of Search ............... 333/153, 193, 194, 195, 333/196

[56] References Cited
U.S. PATENT DOCUMENTS
4,206,426  6/1980  Solie et al. ................ 333/196

*Primary Examiner*—Eli Lieberman
*Attorney, Agent, or Firm*—Howard P. Terry

[57] ABSTRACT

Preferred reflective surface wave processors employ cooperating serially disposed reflector sections. At least one reflecting section comprises an array of non-segmented reflecting grooves in which certain grooves are omitted to form a withdrawal array. Cooperatively coupled to this non-segmented array is an array of segmented grooves. The elements of the segmented array may be made up of progressively fewer segments in regularly spaced lines. The segments in any one segmented line may selectively be of equal lengths randomly spaced within a given line.

14 Claims, 9 Drawing Figures

SURFACE ACOUSTIC WAVE REFLECTORS WITH WEIGHTED ARRAYS OF SEGMENTED AND NON-SEGMENTED LINEAL ELEMENTS

BACKGROUND OF THE INVENTION

1. Field of the Invention

The present invention relates generally to acoustic surface wave energy processors employing acoustical means for processing electrical input signals and yielding modified output electrical signals and, more particularly, concerns surface acoustic wave reflectors with cooperating weighted arrays of segmented and non-segmented lineal elements.

2. Description of the Prior Art

For application in acoustic wave filters, resonators, and the like, suitable acoustic wave reflectors have long been recognized as of significant importance. Weighting has been employed in such reflector devices to produce predetermined reflectivity versus-frequency characteristics. Two types of such reflectors are in general use: 180° reflectors and 90° reflectors, the 180° reflectors being often applied in resonators and the 90° devices in pulse compression and frequency sorting devices and other filters.

As is discussed by W. J. Tanski in the technical paper "SAW Responators Utilizing Withdrawal Weighted Reflectors", I.E.E.E. Transactions on Sonics and Ultrasonics, November 1979, page 404, considerable use has been made of uniformly distributed reflector arrays in such applications. Being uniform, each reflector element in the array has the same length perpendicular to the direction of acoustic energy flow and the same acoustic reflectivity. But the reflection characteristic of a uniform reflector array has relatively strong undesired side lobes, resulting in undesirable resonant modes in surface acoustic wave resonators employing them. Such modes manifest their presence in off-resonance ripple, degrading out-of-band rejection. Further, the reflection phase in a uniformly distributed reflector array has an undesirably steep slope.

Weighting of the individual reflectors of an array may be used to reduce side lobe levels and the slope of the reflection phase. This may be achieved by varying the lengths of each reflector element or by otherwise varying the reflectivity of each reflecting element.

It has also been recognized that useful reflectors may be made by the selective omission of certain reflecting elements. Such omission or withdrawal of elements from the array has proven to reduce reflection side lobes and to eliminate possible distortions due to length weighting. They are evidently simpler to construct, having fewer elements per array. Weighted reflector arrays have also been achieved by replacing the omitted element by a pair of narrow (split) finger elements, by replacing omitted adjacent pairs of elements by a broad finger element, or by relative displacement of reflecting elements. Each kind of omission or withdrawal weighting scheme is effective to a degree; however, the relative coarseness of these techniques make high manufacturing precision impossible.

Dot arrays provide a highly effective way of achieving precise weighting, as described in the L. P. Solie U.S. Pat. No. 4,055,820 for a "Reflective Dot Array for Acoustic Wave Processing", issued Oct. 25, 1977 and assigned to Sperry Corporation. Instead of lineal reflectors, there is employed an array of lines of discrete scattering points, each point with dimensions less than a wave length and disposed at the substrate surface to reflect the incident acoustic wave. While greater freedom from distortion of the response caused by multiple reflections between etched grooves is attained, the dot array concept finds special purpose application primarily where its relatively high cost may be tolerated. Also, withdrawal weighting has generally not demonstrated as high a suppression of side lobes as theoretically predicted or as can be achieved using dot arrays.

SUMMARY OF THE INVENTION

Preferred reflective surface wave processors constructed according to the invention employ cooperating serially disposed reflector sections. At least one reflecting section comprises an array of non-segmented reflecting lines or grooves in which certain grooves are omitted to form a generally conventional withdrawal array. Cooperatively coupled to the non-segmented array is an array of segmented lines or grooves. The elements of the segmented array are made up of progressively fewer and fewer segments in regularly spaced lines, for example. The segments in any one segmented line may selectively be of equal lengths and regularly or randomly spaced within a given line. Such configurations provide increased freedom from distortion and undesired frequency side lobes, while also being less costly to fabricate than the arrangements of the prior art.

DESCRIPTION OF THE PREFERRED EMBODIMENTS

While the invention is discussed herein by way of illustration in application in 180° and 90° reflectors because these are most used in practice, it will be recognized that the invention is equally utile in reflector systems having reflection angles other than these two usual values. The invention will be discussed, as is customary, in connection with drawings whose dimensions and relative proportions are not necessarily representative of dimensions and proportions that would be used in actual practice, simply as a matter of convenience.

Figure 1:
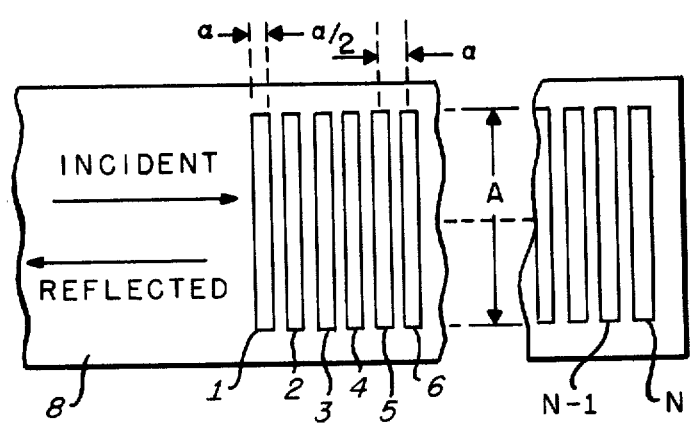
FIG. 1 is a plan view of a representative prior art surface wave reflector.
Figure 2:
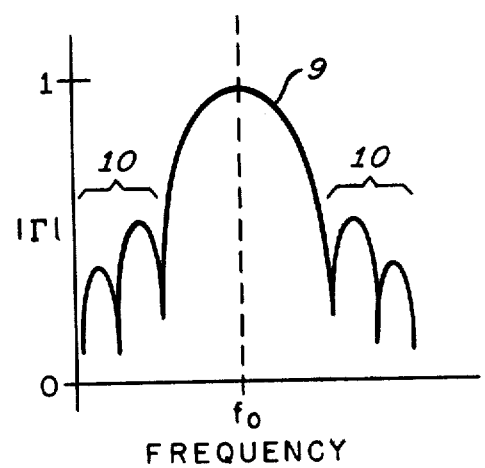
FIG. 2 is a graph showing the reflectivity characteristic of a typical reflector.

The aforementioned prior art and other literature teaches that the basic unweighted 180° reflector element, as shown in FIG. 1, is composed of a long array of N lightly reflecting elements equally distributed along the surface of a piezoelectric or other substrate 8; useful substrate materials include, for example, quartz, lithium niobate, lithium tantalate, bismuth silicon oxide, bismuth germanium oxide, or the like. The reflector elements 1 through N are disposed at a surface of substrate 8 so that the array becomes highly reflective over the relatively narrow frequency band 9 in FIG. 2 with presumably only a tolerable amount of energy going into side lobes as represented at 10, 10'. It will be appreciated that FIG. 2 presents a generalized but typical representation of such a frequency versus reflectivity function. The individual reflector elements may be etched grooves or metal strips, or may be formed at the substrate surface by modification of the substrate material, as by conventional ion implantation.

In the basic reflector system, the total reflection coefficient absolute value $|\Gamma|_{Tot.}$ is maximum, approaching 0.99 for good reflectors at a frequency $f_o$ given by:

$$f_o = v_g/2d, \quad (1)$$

where $v_g$ is the surface wave velocity in the array and d is the period of the array (FIG. 1). The array contains N elements, and each element is d/2 units wide. The acoustic aperture A, which is the length of each array element, is selectively 50 to 100 acoustic wave lengths ($\lambda_o = 2d$). The number N of reflecting elements is to be minimized, but is generally chosen to yield maximum reflectivity. In general, the sum of energy transmitted, reflected, and otherwise lost is normalized as unity, so that:

$$|\Gamma|^2_{Tot.} + |T|^2 + L = 1, \quad (2)$$

where, for a grooved reflector:

$$|\Gamma|^2_{Tot.} = 1 - 4e^{(-Nh/\lambda_o)}, \quad (3)$$

where h is the groove depth in a quartz substrate, for example. For a basic unweighted reflector with a typical groove depth $h = 0.01 \lambda_o$, N will be about 1000. In the basic 90° reflector, where the individual array elements are normally slanted at about 45° to the direction of incoming wave propagation, the reflection coefficient is similar to that of the unweighted 180° reflector of FIG. 1. But the reflection characteristics are of limited utility due to high side lobe levels and to an unremarkable frequency response generally like that of a sin x/x pattern.

As already discussed, the basic 90° reflector has been modified to produce a desirable frequency versus $|\Gamma|_{Tot.}$ characteristic by depth weighting (varying the relative depths of cooperating grooves, which is a process difficult and expensive in practice). Also, dot arrays have been used successfully. The 180° reflectors have been made by withdrawal weighting, as in FIGS. 1 and 2 of the aforementioned Tanski paper.

According to the present invention, 180° reflectors, for example, are cooperatively weighted in such a manner as to reduce the $|\Gamma|_{Tot.}$ side lobes to very low levels. The invention cooperatively uses withdrawal weighting in one section of the reflector composed of parallel grooves, for example. In the remaining end section or sections of the reflector array, weighted segmented lines are employed. In both sections, grooves, metal strips, or material variation may be employed. By joining the two types of weighted arrays, desirable $|\Gamma|_{Tot.}$ responses are achieved, while the photolithographic mask costs are substantially reduced, typically by a factor of three.

Figure 3:
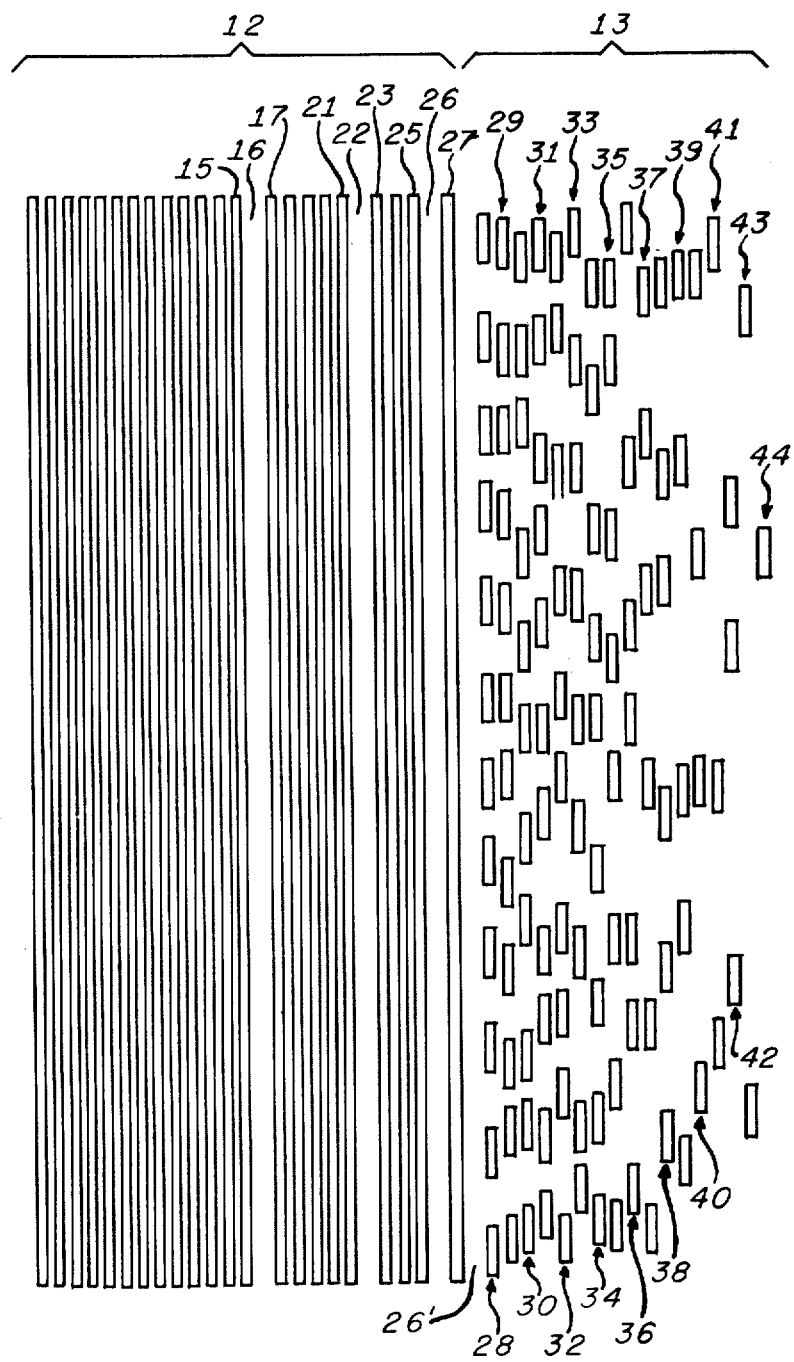
FIG. 3 is a plan view of one form of the invention.

Referring to FIG. 3, a typical configuraton according to the invention is presented, being composed of a withdrawal weighted line array 12 cooperating with line array 13 weighted by segmented lines. Section 12 consists of four subsections in this example, in which it is assumed that each reflecting element, whether unitary or segmented, is a groove. The first subsection includes equal length, substantially equally spaced grooves such as grooves 1 and 15. Where a groove would next appear in the conventional unweighted device, the groove is omitted or "withdrawn", as at 16. The next subsection, comprising substantially equally spaced, equal length grooves 17 through 21, begins where the seventeenth element would begin in the corresponding unweighted line array, while no corresponding groove or slot appears at 22. The third subsection uses three slots 23 through 25. No slot appears at 26 where, in the unweighted device, a slot would actually be found. Slot 27 is the final non-segmented element making up section 12, a slot again being omitted at 26'.

If the reflecting array of FIG. 3 were completed by a second section made up of complete unitary grooves or slots of the same lengths as slots 1 through 15, for example, they would form a second substantially regularly spaced array starting at 28 and ending at 44. However, in the present invention, longitudinally aligned segmented slots replace the integrated ones formerly used. Segmented line 28, for example, consists of twelve segments, each rectangularly shaped and longitudinally aligned. These slot segments are of substantially equal lengths, but are not necessarily equally spaced apart. In fact, it is elected to use substantially equal length segments throughout all of the subsection 13 lines, but they are generally not equally spaced apart longitudinally. It is observed that segmented line 29 also has twelve segments, lines 30 and 31 have eleven, 32 has ten, 33 and 34 have nine, 35 has eight, 36 has seven, 37 and 38 have six, 39 has five, 40 has four, 41 and 42 have three, 43 has two, and 44 has one. Longitudinal spacing increases in magnitude and randomness progressing from segmented line 28 toward the single segment line 44. The number of line segments in each segmented line is proportional to the desired reflectivity for that segmented line.

Figure 4:
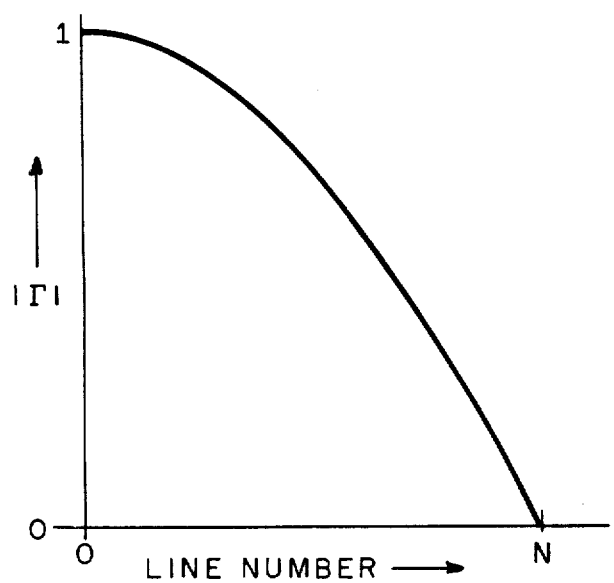
FIG. 4 is a graph useful in explaining the operation of the invention.
Figure 5:
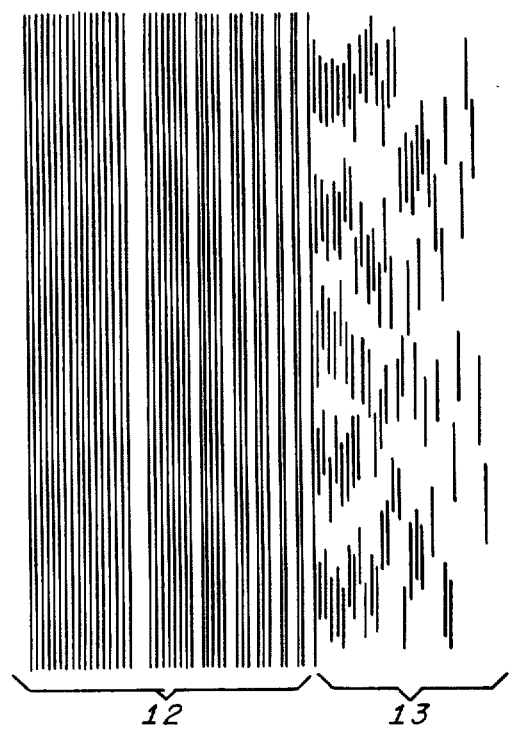
FIG. 5 is a plan view of a further form of the invention.

From the foregoing, the alternative structure of FIG. 5 will also be readily understood. Here, because of the large number of array elements, the elements are shown, for convenience, merely as lines, rather than in the actual rectangular forms illustrated in FIGS. 1 and 3. It is observed that the non-segmented section 12 includes forty-six integrated lines or grooves separated by seven omitted grooves. The subsection 13 again uses an array of segmented lines arranged in such a way that, in cooperation with subsection 12, the local reflection coefficient $|\Gamma|_{Loc.}$ cosine characteristic of FIG. 4 is achieved. The figures represent a situation in which the change from the unsegmented line section 12 to the segmented line section 13 is made at $|\Gamma|_{Loc.} = 0.6$.

In designing a reflector consisting of sections 12 and 13 of the invention as represented, for example, in FIG. 3, the total number of reflecting elements $N_G$ necessary to achieve a selected total reflectivity $|\Gamma|_{Tot.}$ is first established. A weighting function is then selected, for example, a cosine function such as cos $\pi x/2$ L, where x is the position of a line along the reflector array from the line at the input end of the reflector and L is the total length of the weighted reflector. The length $L = N_t d$ and $N_t$ for the weighted array is then determined by following the procedure set forth in the aforementioned Tanski technical paper, especially in connection with equation 10 of page 406 thereof. Withdrawal weighting is implemented up to the selected point x were segmented line weighting begins. The total number of reflecting element positions is $N_t$, though only a portion of these positions contains reflecting elements in the withdrawal-weighted section. All of the element positions contain segmented reflecting elements in the segmented reflector section.

The cosine function and the Hamming function are most useful for resonator reflectors; the latter is represented, for example, by $0.08 + 0.92 \cos \pi x/2 L$. Among other weighting functions useful in reflective array filters are the $\sin x/x$, Dolph-Tchebyscheff, and Taylor functions. The latter two are respectively discussed as applied in electromagnetic arrays by C. L. Dolph in "A Current Distribution for Broadside Arrays which Optimizes the Relationship Between Beamwidth and Side-Lope Level", *Proceedings of the I.R.E.*, June 1946, page 335 and by T. T. Taylor in "Design of Line Source Antennas for Narrow Bandwidth and Low Side Lobes", *Transactions of the I.R.E. Antennas and Propagation*, January 1955, page 16.

The criterion by which is selected the positions at which grooves are to be omitted in section 12 of FIG. 3 is expressed by Equation 5 of the Tanski article. As the local density of grooves decreases, the surface acoustic wave velocity correspondingly increases; to keep the frequency $f_o$ the same for all parts of the reflector, the period d is correspondingly increased. The foregoing also applies to the segmented line section 13; in general, lines in section 13 having few segments are preferably placed further apart along the direction of wave propagation than are lines containing many segments.

When the array is withdrawal-weighted, the section 12 of the reflector with a value of $|\Gamma|_{Loc.}$ close to unity is lightly weighted and has high reflectivity; this section has fewer lines or grooves removed. However, when the desired value of $|\Gamma|_{Loc.}$ moves closer to zero in the heavily-weighted, low reflectivity array section, many lines or grooves would be left out. It appears that the remaining lines or grooves no longer act properly in concert to achieve the desired result. Unexplained second order effects become significant and seriously degrade the response of the prior art device. This defect of the prior art reflector is overcome by substituting in the low reflectivity section 13 the segmented lines of the present invention. While a range of other values provide to a useful degree the improved operation of the invention, it is found experimentally to be satisfactory to use withdrawal-weighting when the value of $|\Gamma|_{Loc.}$ is greater than or equal to 0.4. Consequently, the segmental line section 13 is used where $|\Gamma|_{Loc.} < 0.4$. While the design procedure is quasi-empirical and it is not possible to present a quantitative theory substantiating the foregoing choice, reflectors using the choice have the desired improved properties and furthermore have minimized cost. Computer aided design is readily exercised by those skilled in the art, as well as empirical adjustments of dimensions and proportions.

Further with respect to the nature of the segmented line section 13, each line position contains one or more line segments, the number of segments being proportional to the desired reflectivity $|\Gamma|_{Loc.}$ for that line. Let it be assumed that the acoustic aperture A is $100 \lambda_o$, which is a realistic value, and that each line segment is $\lambda_o/2$ in length. Then, for $|\Gamma|_{Loc.} = 1$, each segmented line would contain 200 segments. On the other hand, if $|\Gamma|_{Loc.}$ is selected as 0.3, then 30 per cent or 60 of the 200 groove segments would actually be placed in the line.

Figure 6:
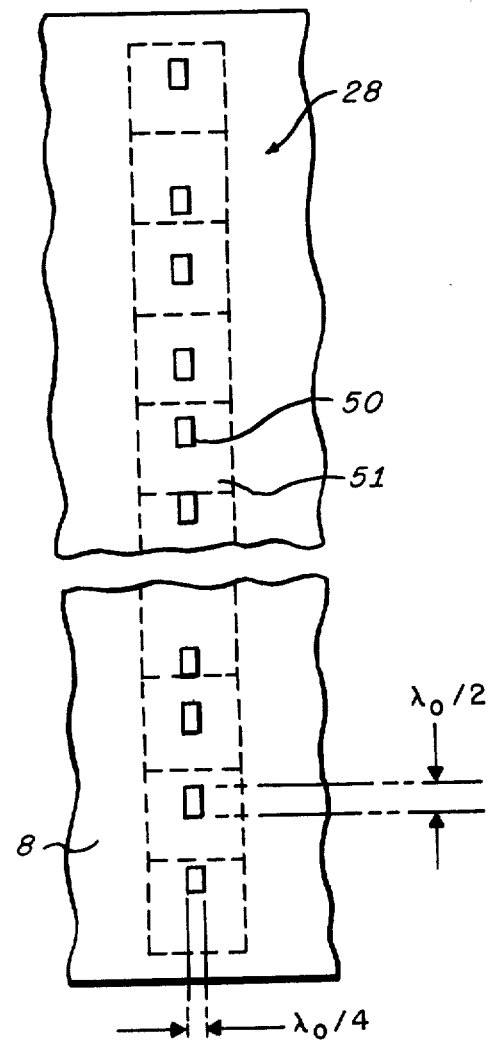
FIG. 6 is a fragmentary detailed view of part of the apparatus of FIG. 5.

Such lines, but having considerable interior randomness, may be planned and constructed according to the following procedure. Referring to FIG. 6, a segmented line such as the segmented line 28 of FIG. 3 may be made by first dividing the area to include the array elements in sixty fictitious equal bins such as bin 51. In each such bin is placed a groove segment, such as groove segment 50 of bin 51. The grooves are $\lambda_o/4$ by $\lambda_o/2$, as shown in the drawing, and are randomly placed within the successive bins. The total length of the bins is $100 \lambda_o$, $|\Gamma|_{Loc.}$ being 0.05 in the example. Each segment 50 is placed at a random location within its associated bin to minimize the production of undesired distortions or reflections.

Figure 7:
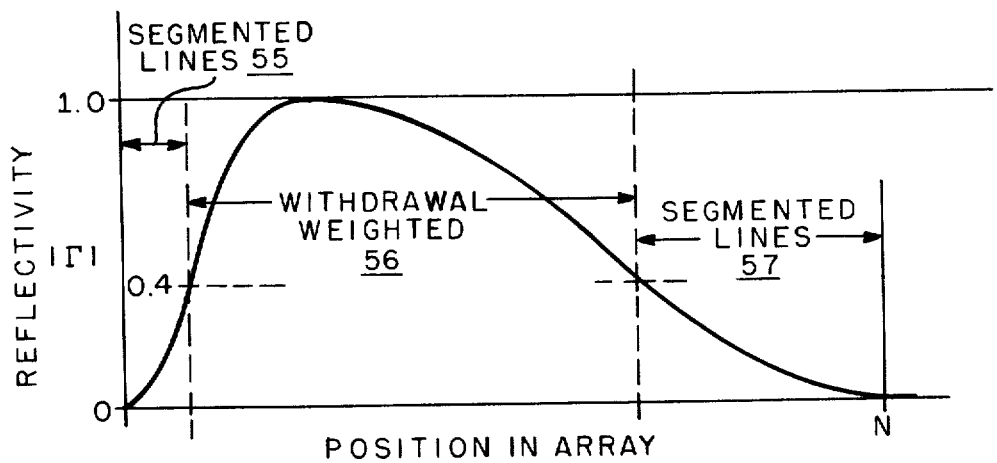
FIG. 7 is a graph useful in explaining forms of the invention shown in FIGS. 8 and 9.
Figure 8:
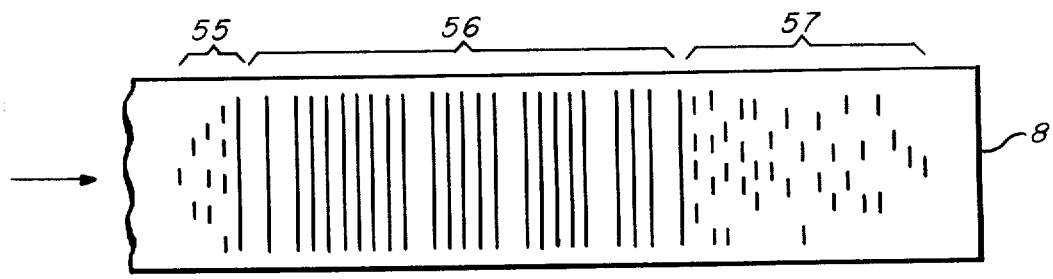
FIGS. 8 and 9 are plan views of further forms of the invention.
Figure 9:
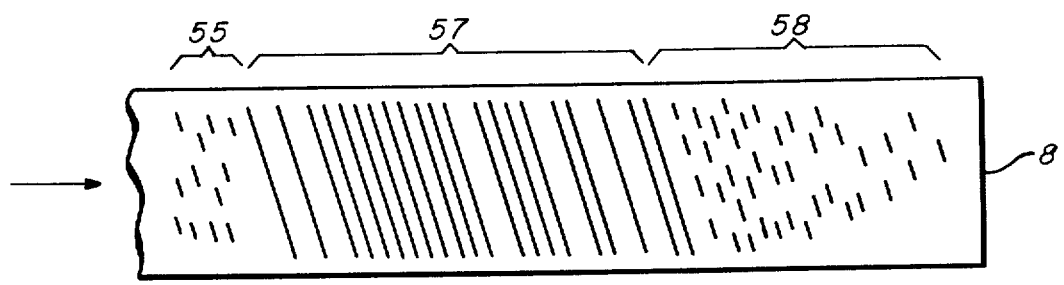

FIGS. 8 and 9 represent 180° and angled reflections, each providing the reflection characteristic of FIG. 7. The FIG. 7 reflection characteristic is desired where it is required to prevent bulk mode scattering by making the input end of the reflector have a gradual change rather than the abrupt step shown in FIG. 4. The function in FIG. 7 otherwise provides results similar to those of FIG. 4. It is noted that the desired reflectivity $|\Gamma|_{Loc.}$ curve of FIG. 7 has subsections which demand relatively low reflectivity elements disposed at each end of a central high reflectivity region. As in FIG. 8, this may be implemented by use of a segmented line section 55 coupled to a withdrawal array 56. The reflector is terminated by a second segmented line array 57. Each line or line segment in the drawing may represent a groove in the substrate, the grooves being $\lambda_o/4$ wide. The line period if $\lambda_o/2$. FIG. 9 represents a corresponding angled reflector according to the invention which may, of course, be a 90° reflector.

It is seen that the invention overcomes the problems of the prior art by providing an acoustic surface wave reflector device having cooperating first and second serially disposed sections. A first section, for example is constructed as an array of positionally weighted non-segmented reflector grooves in which certain grooves are omitted to form a generally conventional withdrawl array. Its operation is supplemented by the use of an array of weighted segmented line elements. By the joint action of the two types of arrays, desirably improved operating characteristics are achieved, while manufacturing costs are significantly reduced.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. Apparatus for reflecting an acoustic surface wave comprising:
   a substrate for supporting a surface acoustic wave at a surface thereof,
   first and second reflector sections in side-by-side parallel cooperative relation affixed at said surface,
   said first reflector section including a plurality of lineal reflector elements extending in spaced parallel relation across the path of said acoustic surface wave for reflecting a first portion thereof,
   said second reflector section including a plurality of segmented reflector elements extending normal to said path, each in parallel relation with said lineal reflector elements, for cooperatively reflecting substantially the total of the remainder of said surface wave, said first reflector section being modified according to a predetermined reflectivity function by the absence of predetermined ones of said lineal reflector elements at predetermined locations therein, the number of segments in said segmented reflector elements progressing from a predetermined maximum in the segmented reflector element adjacent said first reflector section to a single segment element most remote from said first reflector section according to said predetermined reflectivity function.

2. Apparatus as described in claim 1 wherein said first and second reflector sections are so disposed and adjusted as to provide substantially a cos $(\pi x/2L)$ reflectivity characteristic, where x is the position along the array of a predetermined reflector element and L is the combined length of the first and second reflector sections.

3. Apparatus as described in claim 1 wherein the transition from said first to said second reflector section is made where $|\Gamma|_{Loc.}$, the local reflectivity at a successive lineal reflector element, is substantially 0.4.

4. Apparatus as described in claim 3 wherein $|\Gamma|_{Loc.}$ in the second reflector section progresses from substantially 0.4 to substantially 0.0.

5. Apparatus as described in claim 3 wherein each segmented reflector element contains a number of segmented elements proportional to the desired local reflectivity $|\Gamma|_{Loc.}$ of that element.

6. Apparatus as described in claim 3 wherein the lineal reflector element at the input of said first reflector section has a local reflectivity $|\Gamma|_{Loc.}$ of unity.

7. Apparatus as described in claim 1 wherein said segments of said segmented reflector elements are randomly distributed within aligned equal bins of each said segmented reflector element.

8. Apparatus as described in claim 7 wherein said segments are of equal length.

9. Apparatus as described in claim 7 wherein said segments comprise grooves in said substrate.

10. Apparatus as described in claim 9 wherein said grooves are $\lambda_o/4$ wide and are $\lambda_o/2$ longitudinally.

11. Apparatus as described in claim 10 wherein said grooves are arranged in non-contacting relation and are longitudinally disposed across said path.

12. Apparatus as described in claim 1 additionally including a third reflector section at the input of said first reflector section.

13. Apparatus as described in claim 12 wherein said third reflector section includes a plurality of segmented reflector elements extending normal to said path, each in parallel relation with said lineal reflector elements, for minimizing the undesired formation of bulk waves within said substrate.

14. Apparatus as described in claim 13 wherein each said third reflector segmented reflector element contains a number of segmented elements proportional to the desired reflectivity of that element.

* * * * *